United States Patent [19]
Keegan et al.

[11] Patent Number: 5,216,245
[45] Date of Patent: Jun. 1, 1993

[54] MULTI-COLOR OPTICAL SHAFT POSITION SENSOR

[75] Inventors: Kevin R. Keegan, Hilton, N.Y.; Frank B. Wiloch, Rochester Hills, Mich.; Michael G. Nicolas, Rochester, N.Y.

[73] Assignee: General Motors Corporation, Detroit, Mich.

[21] Appl. No.: 770,827

[22] Filed: Oct. 4, 1991

[51] Int. Cl.$^5$ .............................................. H01J 5/16
[52] U.S. Cl. ........................... 250/227.23; 250/731.14; 250/226
[58] Field of Search .............. 250/226, 227.18, 227.21, 250/227.23, 231.13

[56] References Cited

U.S. PATENT DOCUMENTS

| | | | |
|---|---|---|---|
| 4,223,216 | 9/1980 | Quick et al. | 250/227.23 |
| 4,320,330 | 3/1982 | Bahr et al. | 318/685 |
| 4,511,797 | 4/1985 | Pohlig et al. | 250/231 |
| 4,525,657 | 6/1985 | Nakase et al. | 318/254 |
| 4,551,715 | 11/1985 | Durbin | 340/671 |
| 4,684,857 | 8/1987 | Llopis | 318/313 |
| 4,740,688 | 4/1988 | Edwards | 250/226 |
| 4,818,922 | 4/1989 | Sears et al. | 318/313 |
| 4,899,093 | 2/1990 | Gleim | 318/254 |
| 5,001,338 | 3/1991 | Boero | 250/227.21 |
| 5,012,090 | 4/1991 | Spillman, Jr. | 250/227.21 |

Primary Examiner—David C. Nelms
Assistant Examiner—Stephone B. Allen
Attorney, Agent, or Firm—Mark A. Navarre

[57] ABSTRACT

This invention is directed to a position detection system for a rotary motor element where color is used to determine the position of the rotary motor element. Different color light pulses are emitted in the direction of a color-coded disk which rotates in accordance with the rotary motor element. The light pulses are reflected back from the disk in distinct combinations which define the position of the rotary motor element. By determining which colors of light are reflected back, the position of the motor element may be determined. The apparatus may be located remote from the position detector to extend the life and the reliability of its electronic components. The angular resolution of a range of rotary positions is dependent upon the number of color regions on the color-coded disk and the number of different colors of light pulses that are emitted.

4 Claims, 3 Drawing Sheets

| SEGMENT | SEGMENT COLOR | REFLECTS | | | ROTARY POSITION |
|---|---|---|---|---|---|
| | | G | R | IR | |
| $C_1$ ($C_1'$) | WHITE | 1 | 1 | 1 | $0°-\theta°$ |
| $C_2$ ($C_2'$) | BLACK | 0 | 0 | 0 | $\theta°-2\theta°$ |
| $C_3$ ($C_3'$) | INFRARED (IR) | 0 | 0 | 1 | $2\theta°-3\theta°$ |
| $C_4$ ($C_4'$) | RED (R) | 0 | 1 | 0 | $3\theta°-4\theta°$ |
| $C_5$ ($C_5'$) | GREEN (G) | 1 | 0 | 0 | $4\theta°-5\theta°$ |
| $C_6$ ($C_6'$) | GREEN/INFRARED | 1 | 0 | 1 | $5\theta°-6\theta°$ |

FIG. 3

MULTI-COLOR OPTICAL SHAFT POSITION SENSOR

In a multi-phase brushless motor, it is necessary to ascertain the position of the rotor with respect to the phase windings in order to energize the appropriate phase windings. This invention relates to a rotor position detector which determines rotor position based on the detection of combinations of light pulses emitted onto and reflected back from a color-coded disk which rotates with the rotor.

BACKGROUND OF THE INVENTION

In brushless DC motor systems, rotor rotation occurs when the phase windings in the stator are energized, creating a magnetic field which interacts with the magnetic field of the rotor. In order to energize the phase windings in the proper sequence, it is necessary to determine the location of the rotor poles relative to the phase windings. When the position of the rotor poles relative to the phase windings is ascertained, the phase windings are energized to produce the appropriate magnetic field. To obtain optimum motor operation, reliable and accurate rotor position information is required.

One method of determining the position of the rotor is to use Hall effect sensors to detect a change in the magnetic field as the rotor poles move past the sensor. Increasing the number of Hall effect sensors will allow for greater resolution. A second method is to monitor the back-EMF generated by the change in the magnetic field in the non-conducting phase winding as the motor rotor rotates. The magnitude and sign of the back-EMF enables the determination of the position of the rotor.

In conventional rotary position detection systems, the electronic components which process the sensor signals are mounted at or near the motor where the operating environment is less than ideal. The electronic components may be mounted remote from the motor, but this requires some form of interconnection to relay position information and control signals between the motor and the controller. This increases the overall cost of the system, and also creates the potential for electrical noise to enter the interconnection. Remote mounted controllers also add to the system cost because of additional wiring, which cost will further increase as sensors are added to improve resolution. Hence, there is a need for a position detection system which may be located remote from the motor and which provides a high degree of noise immunity and a minimum of interconnect wiring between the position sensors and the motor controller.

SUMMARY OF THE PRESENT INVENTION

This invention is directed to a position detection system for a rotary motor element where color is used to determine the position of the rotary motor element. Different color light pulses are emitted onto a color-coded disk which rotates in accordance with the rotary motor element. The light pulses are reflected back from the disk in distinct combinations which define the angular position of the rotary motor element. By determining which colors of light are reflected, the position of the motor element may be determined.

The position detection apparatus may be located remote from the motor, enabling placement in an environment more suitable to the operation of electronic components than a placement near the motor. A more suitable environment will extend the life and the reliability of the electronic components. In addition, by using a fiber optic cable for sensor lines which interconnect the position detection apparatus and the motor, thereby eliminating susceptibility to noise, the position detected by the position detection apparatus will be more reliable.

As described herein, pulses of light of different color are alternately emitted onto fiber optic cables. The fiber optic cables terminate at one end at the motor, facing a color-coded disk which rotates with the motor rotor. Because light pulses of different colors are emitted and the color-coded disk includes regions of mutually distinct colors, certain light pulses will be reflected back depending on which region of the disk onto which the light pulses are emitted. The color regions on the disk are arranged in a predetermined manner, and the motor end of the fiber optic coupling is positioned at a known position so that the rotor position relative to the phase windings may be determined. By examining which combinations of light are reflected, it is possible to determine a range of rotary positions of the motor rotor.

The angular resolution of a range of rotary positions is dependent upon the number of color regions on the color-coded disk and the number of different colors of light pulses that are emitted. If both are increased, smaller ranges of angular position are attainable. Furthermore, this system would be adaptable to almost any application that requires the determination of the absolute position of a rotary element.

BRIEF DESCRIPTION OF THE DRAWINGS

FIG. 3 is a table which shows the relationship between the color region of the color-coded disk of FIG. 2, the colors of light within that region, and the corresponding rotary position of the disk.

DETAILED DESCRIPTION OF THE INVENTION

Figure 1:
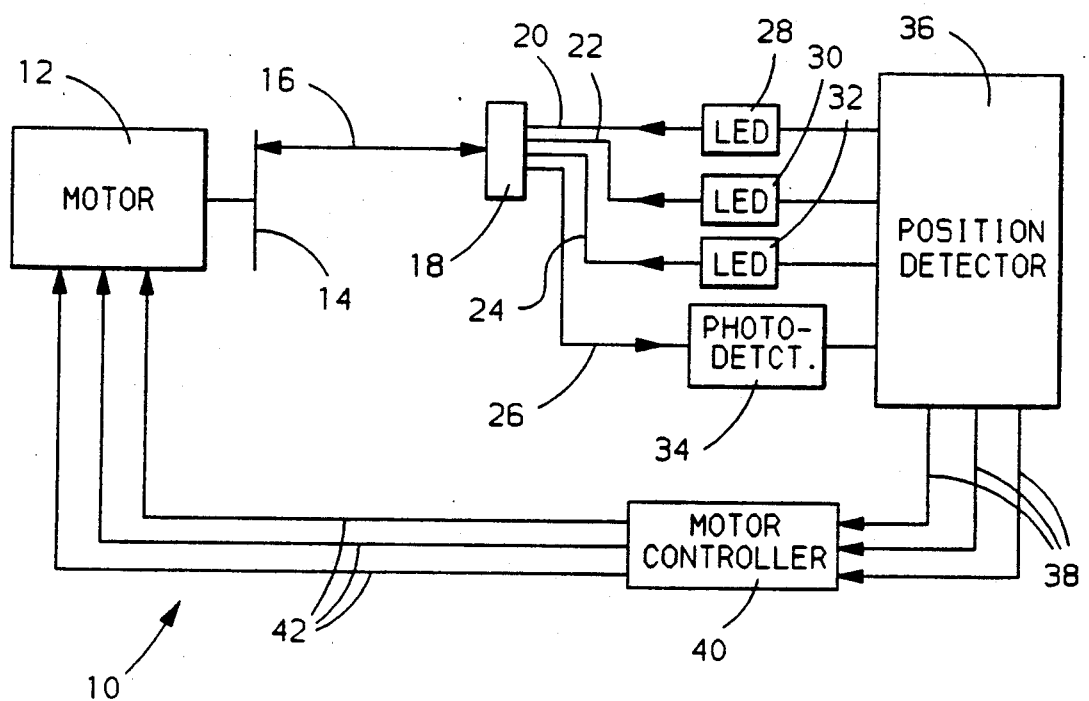
FIG. 1 is a block diagram of the position detection apparatus.
Figure 2:
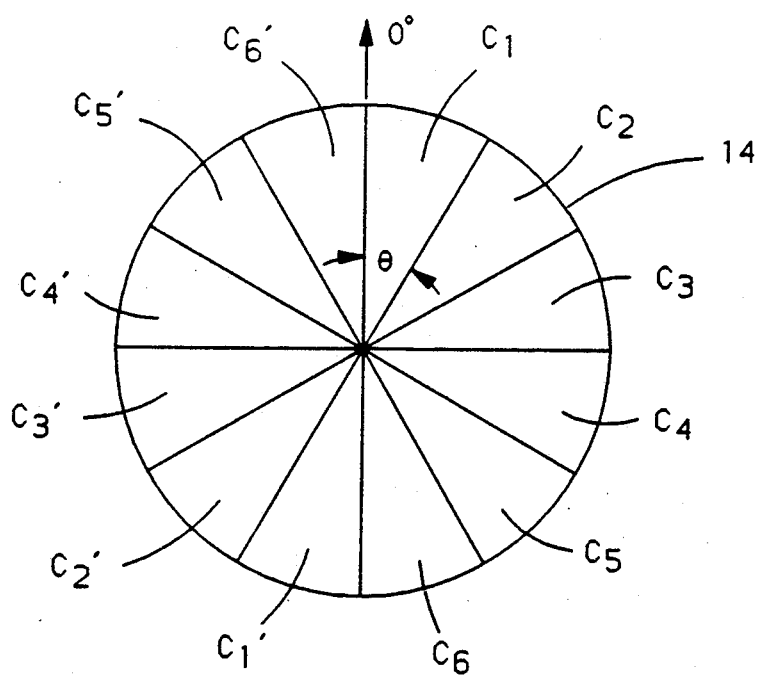
FIG. 2 is a drawing of the color-coded disk, including one possible configuration of the color regions arranged on the disk.

FIG. 1 depicts a system diagram of the position detection apparatus 10. An electrical motor 12, which as shown here is a three-phase brushless DC motor, has attached to its rotor a color-coded disk 14 which rotates in conjunction with the -motor rotor (not shown). One surface of color-coded disk 14 is divided into different color regions as shown in FIG. 2, where a color region will reflect light of its color when the same color of light is directed onto that region. In proximity to the color-coded surface of color-coded disk 14 is one end of fiber optic coupling 16 which terminates at its other end to fiber optic connector 18. Fiber optic coupling 16 is a bi-directional fiber optic cable which transmits light pulses from fiber optic connector 18 to color-coded disk 14 and also transmits light reflected from color-coded disk 14 in the direction of fiber optic connector 18.

Fiber optic connector 18 joins fiber optic coupling 16 to the ends of four smaller fiber optic couplings 20, 22, 24, and 26. The other ends of three of the fiber optic couplings 20, 22, and 24 connect to light emitting diodes (LED's) 28, 30, and 32, respectively; the other end of fiber optic coupling 26 connects to a photo-detector 34.

Fiber optic couplings 20-26 connect to fiber optic coupling 16 via fiber optic connector 18 so that they abut coupling 16, allowing light traveling in couplings 20, 22, or 24 to transfer to coupling 16, and reflected light traveling in fiber optic coupling 16 to transfer to fiber optic coupling 26. To accomplish this four-to-one splitting at fiber optic connector 18, the diameter of fiber optic coupling 16 is approximately twice the diameter of any of fiber optic couplings 20-26, which are approximately the same size. Four-to-one splitting of the fiber optic coupling reduces the number of fiber optic cables required at the motor to only one cable and also avoids the difficulties of aligning four fiber optic cables at the color-coded disk 14.

LED's 28, 30, and 32 are driven by position detector 36, and they emit light of mutually distinct colors. For example, LED's 28, 30, and 32 emit pulses of light which are red, infrared, and green, respectively. Control lines from position detector 36 activate LED's 28-32, initiating an emission of light pulses which travels through their respective fiber optic couplings 20-24, into fiber optic coupling 16, then onto the face of color-coded disk 14.

Photo-detector 34 detects the presence of light reflected back from color-coded disk 14 into fiber optic coupling 16, then fiber optic coupling 26. Photo-detector 34 as described herein detects light of a minimum amplitude, not of a specific color. As such, a color of light detected on coupling 26 with an amplitude greater that the minimum detection amplitude will generate signals indicating to position detector 36 that reflected light has been detected.

Position detector 36 synchronizes and generates the control signals to drive LED's 28-32 and monitors photo-detector 34 for the detection of reflected light. Position detector 36 also determines the rotary position of color-coded disk 14 and, thus, the motor rotor. After error checking and validation, to be described with reference to FIG. 4, the position detector 36 generates control signals sent to motor controller 40 on control lines 38. An example of one such motor controller is disclosed in U.S. Pat. No. 4,544,868, issued on Oct. 1, 1985, and assigned to the assignee of the present invention. The appropriate phase windings are then energized in accordance with the rotary position of the motor rotor using control lines 42.

FIG. 2 is a view of the face of color-coded disk 14 which is adjacent fiber optic coupling 16. The facial view of the disk shows 12 regions $C_1$-$C_6$ and $C_1'$-$C_6'$. Regions $C_1$-$C_6$ are each of a distinct color, and regions $C_1'$-$C_6'$ are also each of a distinct color; however, regions $C_1$, $C_2$, $C_3$, $C_4$, $C_5$, and $C_6$ are the same color as $C_1'$, $C_2'$, $C_3'$, $C_4'$, $C_5'$, and $C_6'$, respectively. Shown in region $C_1$ is an angle j which indicates the angular sweep of that color region. Because each color region sweeps approximately the same angle, each region can be said to sweep j degrees Also shown is a zero degree reference which represents the rotary position in degrees relative to the end of fiber optic coupling 16 which faces color-coded wheel 14. While the assignment of a zero degree reference as described herein in FIG. 2 is arbitrary, the actual assignment of a zero degree reference establishes a relationship between the location of the rotor poles and the phase windings.

FIG. 3 depicts one possible relationship between the color regions and the angular position of color-coded disk 14, using j as described in FIG. 2 as a reference angle. Regions $C_1$-$C_6$ ($C_1'$-$C_6'$) are coded with one or more colors to identify that region. The disk regions $C_1$-$C_6$ ($C_1'$-$C_6'$) are color coded with one or more colors using a thin film deposition process. Colors on the disk reflect light of like color, and absorb light not of like color when light pulses are projected onto the disk. Specific colors of light are reflected by each color region as shown in the column labeled "REFLECTS" (where 1 indicates a detection by photo-detector 34 of a reflection and 0 indicates no detection of a reflection). From the combination of reflections, the color of the region adjacent the fiber optic coupling 16 may be identified and the rotor position may be detected. Regions $C_1'$-$C_6'$ are shown parenthetically to indicate that the range of rotary positions is equivalent to regions $C_1$-$C_6$ for the purpose of determining which phase windings to energize. For the purposes of determining the rotor's mechanical position, $C_1'$-$C_6'$ are determined by adding 180 degrees to the range of rotary positions shown. As an example, region $C_6$ ($C_6'$) is color coded green and infrared, thus, color-coded disk 14 will reflect light pulses of green and infrared if region $C_6$ ($C_6'$) is adjacent fiber optic coupling 16. Accordingly the range of rotary positions is 5j-6j. If region $C_6'$ is adjacent fiber optic coupling 16, the range of rotary positions is (5j+180)-(6j+180). In this particular embodiment, because the colors of regions $C_1$-$C_6$ cover a range of 180 degrees, then repeat in regions $C_1'$-$C_6'$, 30 degree resolution is obtained over 180 degrees of rotation. Thus, in this particular embodiment, rotor position is determined over 360 degrees of mechanical rotation by identifying regions over two consecutive, identical 180 intervals each with a resolution of 30 degrees.

Figure 4:
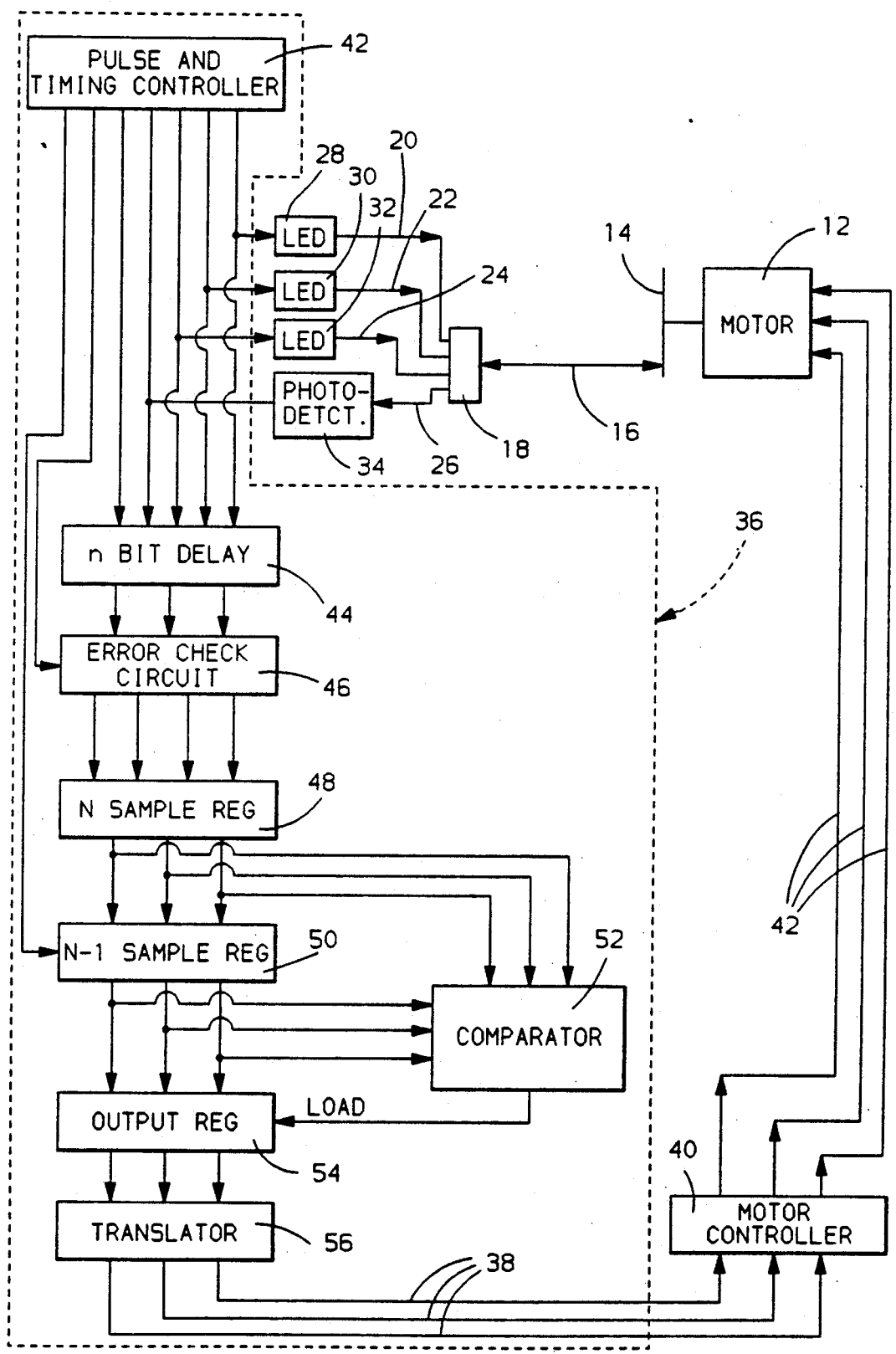
FIG. 4 is a detailed block diagram of the position detection apparatus shown in FIG. 1.

FIG. 4 is a more detailed block diagram of the optical position detection system shown in FIG. 1. It specifically details position detector 36 which determines the rotary position of the motor rotor. System timing and synchronization is controlled by pulse and timing controller 42. To determine the position of the rotor, one of LED's 28, 30, or 32 must be activated to emit a light pulse onto the reflective disk 14. A light pulse emission is then followed by a time period during which reflected light may or may not, depending on the color region of color-coded disk 14 adjacent fiber optic cable 16, be detected by photo-detector 34. This sequence is then repeated for the two remaining LED's.

Delay element 44 is a temporary storage element which associates each bit with one of the LED's 28-32 that emits light onto reflective disk 14. Each bit of delay element 44 corresponds to a predetermined color so that when an LED emits a pulse of light, the bit which corresponds to that LED will be set if a reflection is detected and left cleared if no reflection is detected. The control line that activates an LED also enables the bit which corresponds to that LED to determine if light has been reflected while disabling the other bits from detecting that light pulse. If a reflection is detected the bit corresponds to that LED is set, and if no reflection is detected the bit is not set. After each of the LED's has been pulsed, the contents of n-bit delay element 44 indicates whether the photo-detector 34 detected reflected light following the activation of each LED.

At the completion of the cycle of pulsing the LED's and determining if there have been reflections for each pulse, error checking takes place at block 46 to insure that the combinations of reflections indicate a valid color. For example, referring to FIG. 3, if reflections are detected only in response to pulses from LED's 28 and 30 (red and infrared, respectively) an erroneous combination of reflected light has been detected as no color region of color-coded wheel 14 would reflect this combination. In such a case, n-sample register 48, which stores the last non-erroneous combination of reflections, is not loaded with the new combination and position detection will be based on the last non-erroneous sample.

If no error is detected, error check block 46 sends a load signal (LOAD) to n-sample register 48 which loads n-sample register 48 with the contents n-bit delay register 44. The comparator 52 then compares the contents of (n-1) sample register 50, where the (n-1) sample is the next to last non-erroneous combination of reflections detected, with the contents of n-sample register 48. If the samples are identical, the (n-1) sample is loaded into output register 54, after which the contents of n-sample register 48 are loaded into (n-1) sample register 50. That is, it is necessary to have two, non-erroneous, identical samples before using that sample to determine the position of the motor rotor. If the samples are not identical, output register 54 remains unchanged, and the previous rotor position is used for motor control. Output register 54 now stores a combination that indicates a range of rotary positions of the motor rotor as detailed in FIG. 3. The combination in output register 54 is then translated by translator 56 to a format required by motor controller 40. Motor controller 40 then receives the position of the rotor via lines 38 and determines which phase windings should be energized, activating the proper control lines 42 which connect to the motor windings.

The cycle of pulsing light, detecting reflections, error checking, and region validation is repeated continuously to effectuate motor control. Because validation requires two identical, non-erroneous samples, it is necessary to be able to perform at least two cycles per color region while the motor operates at maximum speed. Thus, the minimum cycle period will be related to the degree of error checking carried out, the maximum speed of the motor, and the number of color regions on the color-coded disk 14.

While this invention has been described in reference to the illustrated embodiment, it will be understood that the scope of the present invention is not limited thereto. Various modifications to the illustrated embodiment may occur to those skilled in the art, and it should be understood that systems incorporating such modifications may also fall within the scope of this invention, while is defined by the appended claims.

The embodiments of the invention in which an exclusive property or privilege is claimed are defined as follows:

1. Rotary position detection apparatus for a rotary motor element comprising:
    disk means including a reflective surface mounted to rotate with said motor element, said reflective surface being divided into a plurality of different color regions;
    a fiber optic coupling having a first end disposed in proximity to said reflective surface so as to sequentially register with the color regions of said disk means as the motor element rotates, and a second end located remote from said disk means;
    source means including a plurality of light sources for sequentially emitting pulses of light of mutually distinct color into said second end, such light pulses being directed onto said reflective surface via the fiber optic coupling for reflection by a region comprising a like color;
    a photo-detector located in proximity to said second end for detecting the presence of light having an amplitude in excess of a minimum detection amplitude reflected from the reflective surface of said disk means via the fiber optic coupling; and
    logic means for determining the rotary position of said motor element based on an identification of which light pulses of the plurality of light source result in the detection of reflected light by said photo-detector.

2. The apparatus set forth in claim 1, wherein the light pulses of said source means are emitted at a repetition rate sufficient to sequentially emit said light pulses at least twice during the registry of said first end with each of said color regions.

3. The apparatus set forth in claim 1, wherein said logic means for determining the rotary position of said motor element includes:
    means for detecting for each color of emitted light pulse in a particular sequence the presence of reflected light, defining for said sequence a combination of reflections from the reflective surface;
    means for determining from the combination of reflections which color region is in registry with said first end of the fiber optic coupling, where a particular color region of the reflective disk will reflect a mutually distinct combination of reflections; and
    means for associating a color region with a range of rotary positions where said color regions are positioned on the reflective surface in a predetermined manner to thereby identify the rotary position of said element.

4. The apparatus as set forth in claim 4, wherein said logic means further includes:
    means for verifying that the combination of reflected light detected by the photo-detector is a combination which is reflected by at least one of the plurality of color regions of the reflective disk to insure that the combination identifies an actual color region, defining a valid combination;
    means for storing successive, valid combinations of reflected light, where the combinations represent reflections for two most recent valid combinations of reflected light; and
    means for comparing said stored combinations of reflected light to insure that they are identical, where identical combinations verify that a specific color region is in registry with said first end of the fiber optic coupling and non-identical combinations indicate an indefinite determination of what color region is in registry with said first end.

* * * * *